(12) United States Patent
Cok et al.

(10) Patent No.: US 7,719,182 B2
(45) Date of Patent: May 18, 2010

(54) OLED DEVICE HAVING IMPROVED LIGHT OUTPUT

(75) Inventors: Ronald S. Cok, Rochester, NY (US);
Joseph F. Revelli, Jr., Rochester, NY (US); Joel D. Shore, Rochester, NY (US); Lee W. Tutt, Webster, NY (US);
Donald R. Preuss, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 744 days.

(21) Appl. No.: 11/232,555

(22) Filed: Sep. 22, 2005

(65) Prior Publication Data

US 2007/0063641 A1    Mar. 22, 2007

(51) Int. Cl.
*H01J 1/62* (2006.01)
*H01J 63/04* (2006.01)

(52) U.S. Cl. .................. 313/506; 313/503; 313/504; 313/509; 313/498

(58) Field of Classification Search .............. 313/11, 313/498–512
See application file for complete search history.

(56) References Cited

U.S. PATENT DOCUMENTS

| | | | |
|---|---|---|---|
| 3,659,918 A * | 5/1972 | Tan | .............. 313/371 |
| 4,476,292 A | 10/1984 | Ham et al. | |
| 4,769,292 A | 9/1988 | Tang et al. | |
| 5,247,190 A | 9/1993 | Friend et al. | |
| 5,780,174 A | 7/1998 | Tokito et al. | |
| 5,889,570 A * | 3/1999 | Mitsui et al. | ................. 349/113 |
| 6,326,224 B1 | 12/2001 | Xu et al. | |
| 6,366,017 B1 * | 4/2002 | Antoniadis et al. | .......... 313/506 |
| 6,406,801 B1 | 6/2002 | Tokito et al. | |

(Continued)

FOREIGN PATENT DOCUMENTS

EP    1 372 200    12/2003

(Continued)

OTHER PUBLICATIONS

"Evaluating Optical Contact Bonds Using Thin-Film ZnO Transducers" by Fred S. Hickernell. (p. 338 included).*

(Continued)

*Primary Examiner*—Toan Ton
*Assistant Examiner*—Zachary Snyder
(74) *Attorney, Agent, or Firm*—McKenna Long & Aldridge LLP

(57) ABSTRACT

An organic light-emitting diode (OLED) device, comprising: first and second non-metallic transparent electrodes, and one or more layers of organic material formed between the first and second non-metallic transparent electrodes, the layers of organic material including one or more light-emitting layers; and one or more non-metallic reflective layers located on a side of either of the first or second non-metallic transparent electrodes opposite to the organic material layers; wherein the device further comprises a light transmissive scattering layer in optical contact with the organic material layers and the electrodes or wherein at least one of the one or more non-metallic reflective layers comprises a reflective scattering layer in optical contact with the organic material layers and the electrodes. Additionally, a low-index layer is preferably employed in various embodiments to improve device sharpness.

16 Claims, 8 Drawing Sheets

U.S. PATENT DOCUMENTS

| | | | |
|---|---|---|---|
| 6,420,031 B1 * | 7/2002 | Parthasarathy et al. ... 428/411.1 | |
| 6,670,772 B1 | 12/2003 | Arnold et al. | |
| 6,737,800 B1 | 5/2004 | Winters et al. | |
| 6,782,179 B2 * | 8/2004 | Bozhevolnyi et al. ....... 385/131 | |
| 6,911,772 B2 | 6/2005 | Cok | |
| 7,102,282 B1 * | 9/2006 | Yamada et al. .............. 313/506 | |
| 2001/0033135 A1 * | 10/2001 | Duggal et al. .............. 313/506 | |
| 2004/0012980 A1 * | 1/2004 | Sugiura et al. ............. 362/560 | |
| 2004/0061136 A1 * | 4/2004 | Tyan et al. ................. 257/200 | |
| 2004/0217702 A1 | 11/2004 | Garner et al. | |

FOREIGN PATENT DOCUMENTS

| | | |
|---|---|---|
| EP | 1 406 474 | 4/2004 |
| JP | 11-288786 | 10/1999 |

OTHER PUBLICATIONS

Scanned information from Handbook of Chemistry and Physics.*
"Evaluating Optical Contact Bonds Using Thin-Film ZnO Transducers" by Fred S. Hickernell. Jun. 2006.*
Handbook of Chemistry and Physics, 86th edition, Mar. 2005.*
P.A. Hobson et al., "The Role of surface Plasmons in Organic Light-Emitting Diodes" IEEE J.on Selected Topics in Quantum Electronics, vol. 8, No. 2, Mar. 2002.
L. Persano et al. "Monolithic organic-oxide microcavities fabricated by low-temperature electron-beam evaporation", Am. Institute of Physics, vol. 23, No. 4, Jul. 22, 2005.
C. W. Tang and S. A. VanSlyke; "Organic Electroluminescent Diodes"; Applied Physics Letter; vol. 51; No. 12; Sep. 21, 1987; pp. 913-915.
C. W. Tang, S. A. VanSlyke, and C. H. Chen; "Electroluminescence Of Doped Organic Thin Films"; Journal applied Physics; vol. 65; No. 9; May 1, 1989; pp. 3610-3616.
R. H. Jordan, L. J. Rothberg, A. Dodabalapur, and R. E. Slusher; "Efficiency Enhancement Of Microcavity Organic Light Emittng Diodes"; Applied Physics Letter; vol. 69; No. 14; Sep. 30, 1996; pp. 1997-1999.
H. Yokoyama; "Physics and Device Applications Of Optical Microcavities"; Science; vol. 256; Apr. 3, 1992; pp. 66-70.
U.S. Appl. No. 11/065,082; filed Feb. 24, 2005; "OLED Device Having Improved Light Output"; of Ronald S. Cok, Donald R. Preuss, and Yuan-Sheng Tyan.

* cited by examiner

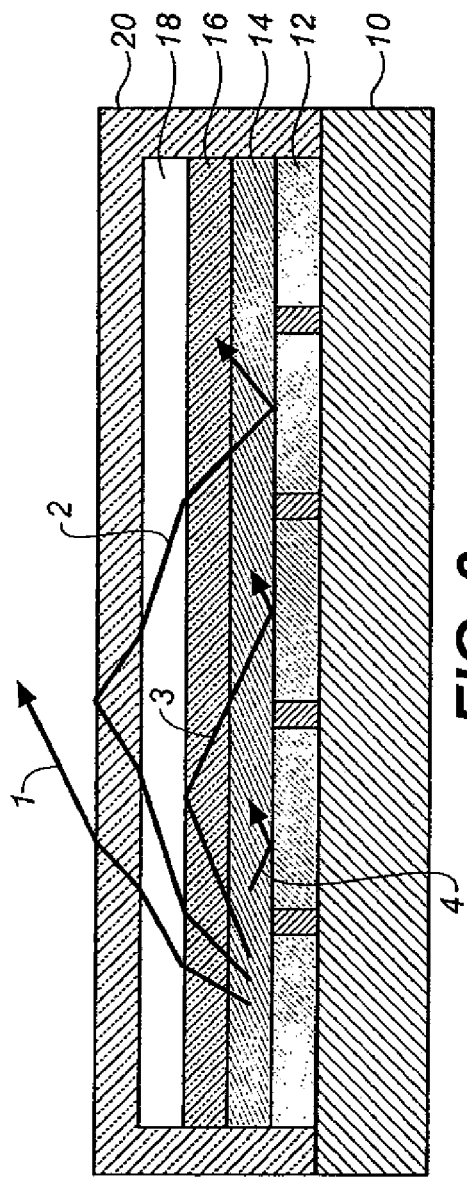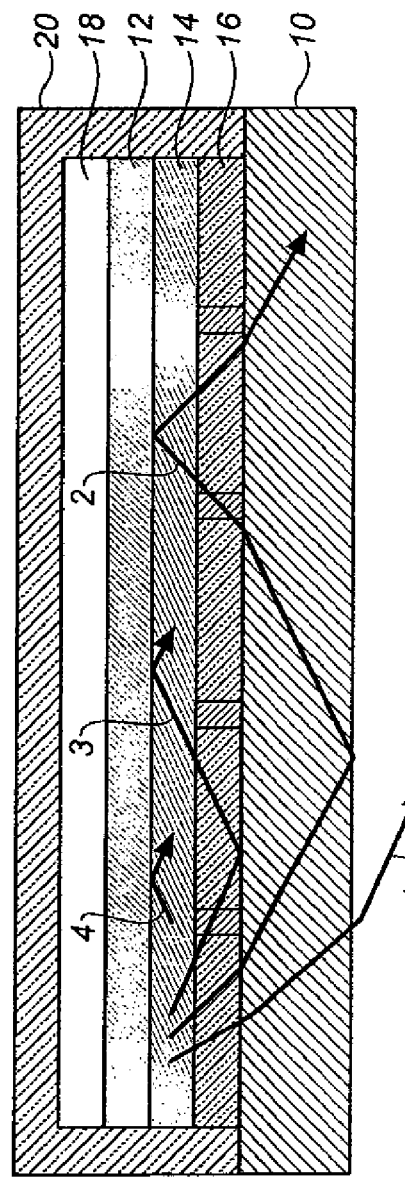
FIG. 6 (PRIOR ART)
FIG. 7 (PRIOR ART)

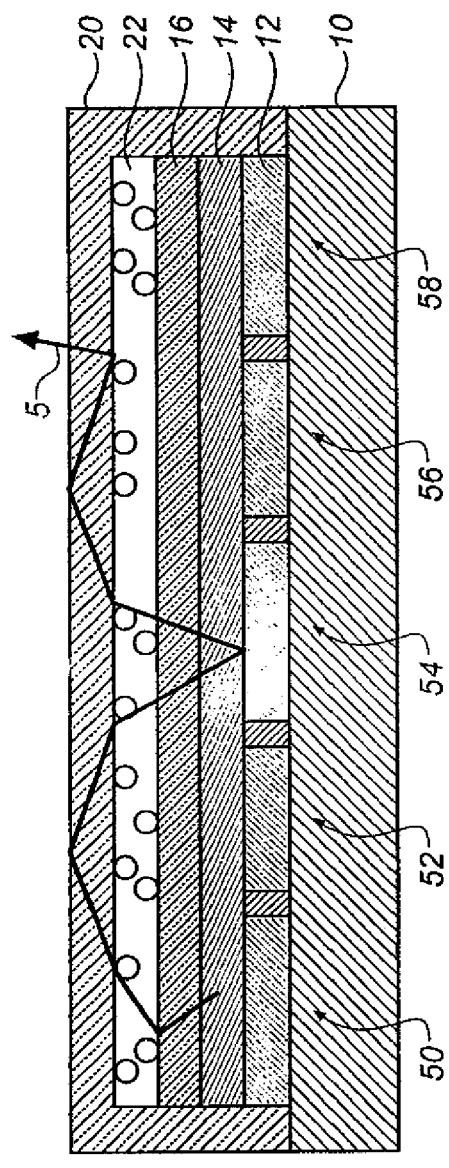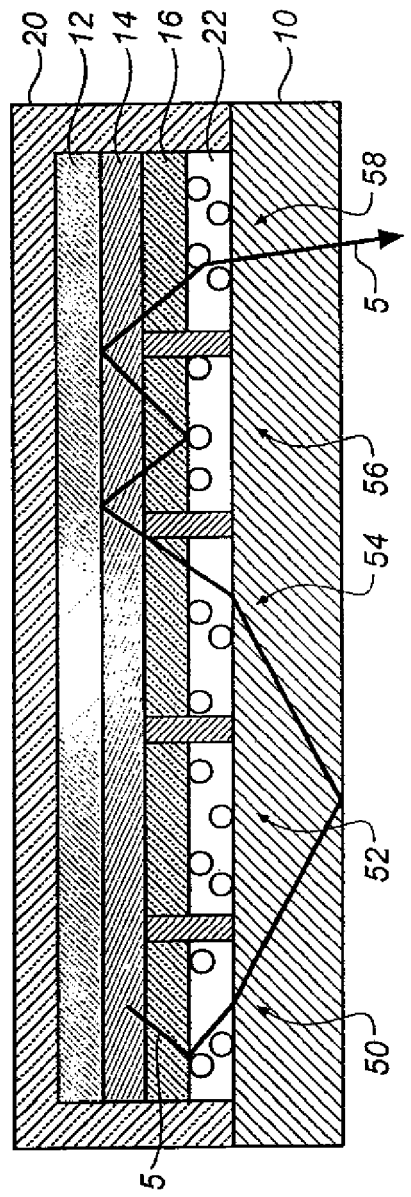
FIG. 8 (PRIOR ART)
FIG. 9 (PRIOR ART)

OLED DEVICE HAVING IMPROVED LIGHT OUTPUT

FIELD OF THE INVENTION

The present invention relates to organic light-emitting diode (OLED) devices, and more particularly, to OLED device structures for improving light output.

BACKGROUND OF THE INVENTION

Organic light-emitting diodes (OLEDs) are a promising technology for flat-panel displays and area illumination lamps and backlights. The technology relies upon thin-film layers of materials coated upon a substrate. However, as is well known, much of the light output from the light-emissive layer in the OLED is absorbed within the device. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic electroluminescent (EL) element, and a cathode. The organic EL element disposed between the anode and the cathode commonly includes one or more of an organic hole-injection layer (HIL), an organic hole-transporting layer (HTL), an emissive layer (EML), an organic electron-transporting layer (ETL) and an organic electron-injection layer (EIL). Holes and electrons recombine and emit light in the EML layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes recombine and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. In most cases, these trapped photons are eventually absorbed, never leaving the OLED device, although some of these photons may escape from the edge of the device. In either case, they make no contribution to the useful light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent (or semitransparent) cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. Using ray optics, it has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 2, a top-emitting OLED device as suggested by the prior art is illustrated having a substrate 10 (either reflective, transparent, or opaque). Over the substrate 10, a semiconducting layer is formed providing thin-film electronic components 30 for driving an OLED. An interlayer insulating and planarizing layer 32 is formed over the thin-film electronic components 30 and a first patterned reflective metal electrode 12 defining OLED light-emissive elements is formed over the insulating layer 32. An inter-pixel insulating film 34 separates the elements of the patterned reflective metal electrode 12. One or more first layers 14 of organic materials described above, one of which emits light, are formed over the patterned reflective metal electrode 12. A transparent second electrode 16 is formed over the one or more first layers 14 of organic material. A gap 18 separates the transparent second electrode 16 from an encapsulating cover 20. The encapsulating cover 20 is transparent and may be coated directly over the transparent electrode 16 so that no gap 18 exists. In some prior-art embodiments, the first reflective electrode 12 may instead be at least partially transparent and/or light absorbing. In a bottom-emitter embodiment, the substrate is transparent and the positions of the transparent and reflective electrodes are reversed. Typically, the reflective metal electrode 12 comprises Al, Ag, Mg, or alloys of these or other reflective metals. The transparent electrode 16 may comprise ITO or other transparent and conductive metal oxides. A semitransparent electrode, e.g. formed from thin metal layers, such as Ag, may also form all or part of this electrode.

As shown in a simpler form in FIG. 6 (for a top-emitter embodiment) and FIG. 7 (for a bottom-emitter embodiment), light emitted from one of the organic material layers 14 can be emitted directly out of the device, through the substrate 10 or cover 20, as illustrated with light ray 1. If the gap 18 either does not exist or is filled with a material whose optical index matches that of the cover or substrate, light may also be emitted and internally guided in the substrate 10 or cover 20 and organic layers 14, as illustrated with light ray 2. Alternatively, light may be emitted and internally guided in the organic layers 14 and electrode 16, as illustrated with light ray 3. Light rays 4 emitted toward the reflective metal electrode 12 are reflected by the reflective metal electrode 12 toward the substrate 10 or cover 20 and then follow one of the light ray paths 1, 2, or 3. Light emitted in these paths may be termed Modes I, II, and III light respectively.

A variety of techniques have been proposed to improve the out-coupling of light from thin-film light emitting devices. In particular, scattering layers employed in optical contact with the OLED layers can disrupt total internal reflection of light within the OLED device and increase the amount of light emitted from an OLED device. However, scattering techniques, by themselves, cause light to pass through the light-absorbing material layers multiple times where they can be absorbed and converted to heat. Moreover, trapped light may propagate a considerable distance horizontally through the cover or substrate before being scattered out of the device, thereby reducing the sharpness of the device in pixellated applications such as displays. For example, as illustrated in FIG. 8, a prior-art pixellated top-emitting OLED device may include a plurality of independently controlled pixels 50, 52, 54, 56, and 58 and a scattering layer 22 located between the cover 20 and the transparent electrode 16. A light ray 5 emitted from the light-emitting layer may be scattered multiple times by scattering layer 22, while traveling through the cover 20, organic layer(s) 14, and transparent electrode 16 before it is emitted from the device. When the light ray 5 is finally emitted from the device, the light ray 5 has traveled a considerable distance through the various device layers from the original pixel 50 location where it originated to a remote pixel 58 where it is emitted, thus reducing sharpness. Most of the lateral travel occurs in the cover 20, because that is by far the thickest layer in the package. (Note that the layer thicknesses in this figure have not been drawn to scale since the thickness differences of the various layers is too great to permit depiction to scale.) Also, the amount of light emitted is reduced due to absorption of light in the various layers. If the light scattering layer is alternatively placed adjacent to the substrate 10 of a prior-art bottom-emitting device as illustrated in FIG. 9, the light may similarly travel a significant distance in the substrate 10 before being emitted.

U.S. Patent Application Publication No. 2004/0061136 entitled "Organic light emitting device having enhanced light extraction efficiency" by Tyan et al., describes an enhanced light extraction OLED device that includes a light scattering layer. Two transparent electrodes may be employed, along with the use of a reflective layer, such as a metal layer, behind one of the transparent electrodes. In certain embodiments, a low index isolation layer (having an optical index substantially lower than that of the organic electroluminescent element) is employed adjacent to a reflective layer in combination with the light scattering layer to prevent high angle (with respect to the normal) light from striking the reflective layer, and thereby minimize absorption losses due to multiple reflections from the reflective layer. The particular arrangements, however, may still result in reduced sharpness of the device and incomplete light extraction.

Referring to FIG. 10, e.g., the sharpness of a bottom-emitting active matrix OLED device employing a light-scattering layer coated on the substrate is illustrated. The average MTF (sharpness) of the device (in both horizontal and vertical directions) is plotted for an OLED device with the light-scattering layer and without the light scattering layer. As is shown, the device with the light-scattering layer is much less sharp than the device without the light scattering layer, although more light was extracted (not shown) from the OLED device with the light-scattering layer. FIG. 10 thus illustrates the reduction in sharpness that occurs when scattering layers are employed as taught in the prior art.

A variety of means for increasing the light output from OLED devices have been proposed. One such technique relies upon forming an optical cavity to increase light output and to control the color of the light output. For example, U.S. Pat. No. 6,737,800B1 describes a multicolor organic light-emitting display having an array of pixels having at least two different colors including a substrate; a reflective layer disposed over the substrate; and a first transparent electrode disposed over the reflective layer. The display also includes a second transparent electrode spaced from the first transparent electrode and an organic EL media disposed between the first and second transparent electrodes and arranged to produce white light. The display further includes at least first and second filters of different colors disposed respectively over different predetermined pixels of the array, and wherein the thickness of the first transparent electrode is separately adjusted for each different color to cause a substantial amount of the reflected component of colored light corresponding to its associated color filter to constructively interfere with a substantial amount of the non-reflected component of colored light corresponding to its associated color filter. However, such OLED designs suffer from manufacturing tolerance difficulties and the color of the light emitted from the device generally depends quite strongly on the angle of emission.

To simultaneously increase the amount of light output from an OLED device and preserve the sharpness and color of a pixellated OLED display device at a variety of viewing angles, co-pending, commonly assigned U.S. Ser. No. 11/065,082, filed Feb. 24, 2005, the disclosure of which is hereby incorporated by reference, describes the use of a scattering layer in combination with a transparent low-index element having a refractive index lower than the refractive index of the encapsulating cover or substrate through which light is emitted from the OLED device and lower than the refractive index range of the OLED element materials. Note that use of such a design is incompatible with optical cavity designs, however, as the scattering layer would destroy the constructive interference upon which such optical cavities rely.

Even the combined use of scattering and low-index layers, however, does not result in the emission of all of the light produced in OLED devices employing a conventional metallic reflective electrode. An electro-dynamic physical and optical model created by applicants demonstrates that the emission of light in the OLED structure employing scattering layers still results in considerable light being lost in the metallic reflective electrode through the formation of surface plasmon-polaritons. An attempt to extract surface plasmon-polaritons from an OLED device in the form of useful light is described in granted U.S. Pat. No. 6,670,772. However, the solution proposed requires very precise manufacturing tolerances and creates a very strong angular dependence on the color of light emitted.

The use of dielectric layers serving to reflect light in an OLED device is known. For example, U.S. Pat. No. 6,911,772 B2 entitled "OLED display having color filters for improving contrast" by Cok describes an OLED display device for displaying a color image, the display device being viewed from a front side includes a plurality of OLED elements including first color elements that emit a first color of light and second color elements that emit a second color of light different from the first color; a reflector located behind the OLED elements; and a corresponding plurality of filter elements aligned with the OLED elements, including first and second color filters for passing the first or second color of light emitted by the corresponding OLED element, and blocking other colors of light. The reflector may comprise a reflective dielectric stack to reduce risk of shorting between patterned electrodes of the OLED elements.

Another method that potentially can improve luminance output efficiency of an OLED device is to use a microcavity effect. OLED devices utilizing a microcavity effect (Microcavity OLED devices) have been disclosed in the prior art (U.S. Pat. Nos. 6,406,801 B1; 5,780,174 A1; and JP 11288786 A). In a microcavity OLED device the organic EL element is disposed between two reflecting mirrors, one of which is semitransparent. The reflecting mirrors form a Fabry-Perot microcavity that strongly modifies the emission properties of the organic EL disposed in the microcavity.

Emission near the wavelength corresponding to the resonance wavelength of the cavity is enhanced through the semitransparent mirror and those with other wavelengths are suppressed. The use of a microcavity in an OLED device has been shown to reduce the emission bandwidth and improve the color purity of emission (U.S. Pat. No. 6,326,224). The microcavity also dramatically changes the angular distribution of the emission from an OLED device. There also have been suggestions that the luminance output could be enhanced by the use of a microcavity (Yokoyama, Science, Vol. 256 (1992) p 66; Jordan et al Appl. Phys. Lett. 69, (1996) p 1997). Both metal layers and dieletric mirror structures (e.g., Quarter Wave Stack (QWS) structures) have been disclosed for use in such devices. A QWS is a multi-layer stack of alternating high index and low index dielectric thin-films, each one approximately a quarter wavelength thick. It can be tuned to have high reflectance, low transmittance, and low absorption over a desired range of wavelength. As noted above, use of optical cavity designs is incompatible with scattering layers.

There is a need therefore for an improved organic light-emitting diode device structure that avoids the problems noted above and improves the efficiency and sharpness of the device.

SUMMARY OF THE INVENTION

In accordance with one embodiment, the invention is directed towards an organic light-emitting diode (OLED) device, comprising: first and second non-metallic transparent electrodes, and one or more layers of organic material formed between the first and second non-metallic transparent electrodes, the layers of organic material including one or more light-emitting layers; and one or more non-metallic reflective layers located on a side of either of the first or second non-metallic transparent electrodes opposite to the organic material layers; wherein the device further comprises a light transmissive scattering layer in optical contact with the organic material layers and the electrodes or wherein at least one of the one or more non-metallic reflective layers comprises a reflective scattering layer in optical contact with the organic material layers and the electrodes. Additionally, a low-index layer is preferably employed in various embodiments to improve device sharpness.

ADVANTAGES

Various embodiments of the present invention have the advantages of increasing the light output from, while maintaining the sharpness of, an OLED device.

BRIEF DESCRIPTION OF THE DRAWINGS

FIG. 6 illustrates different modes of light propagation through a cross section of a top-emitter OLED device;

FIG. 7 illustrates different modes of light propagation through a cross section of a bottom-emitter OLED device;

FIG. 8 illustrates light propagation through a cross section of a prior-art top-emitter OLED device resulting in a lack of sharpness;

FIG. 9 illustrates light propagation through a cross section of a prior-art bottom-emitter OLED device resulting in a lack of sharpness.

Figure 1:
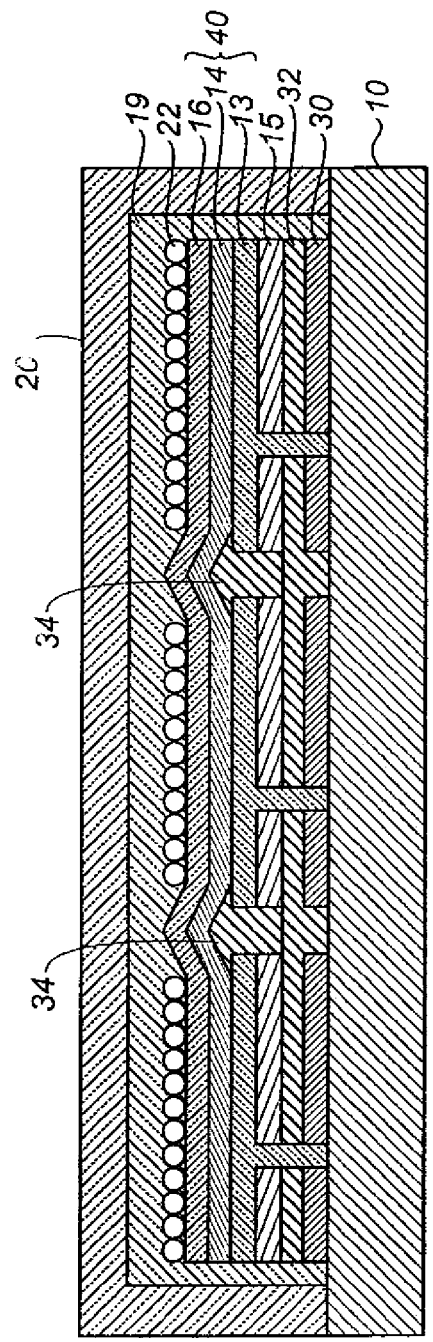
FIG. 1 illustrates a cross section of a top-emitter OLED device having non-metallic reflective and scattering layers according to one embodiment of the present invention.
Figure 2:
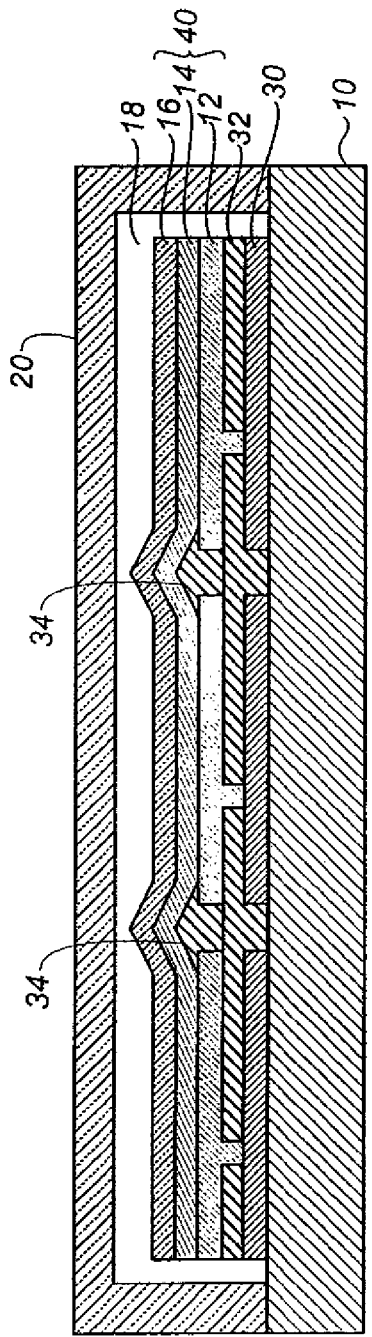
FIG. 2 illustrates a cross section of a top-emitter OLED device as suggested in the prior art.

It will be understood that the figures are not to scale since the individual layers are too thin and the thickness differences of various layers too great to permit depiction to scale.

DETAILED DESCRIPTION OF THE INVENTION

As described above, light generated within an OLED device can be emitted from the device, confined in the substrate or cover, or confined in the organic layers and electrodes. Materials having free electrons in the conduction band, for example metals, support formation of surface plasmons-polaritons in the presence of a radiating dipole. In the visible portion of the electromagnetic spectrum, such materials typically also have a dielectric constant with a negative real part. Accordingly, if a metallic, light-reflective electrode layer surface is located in proximity to an OLED emissive layer, some electrical energy may be converted to optical energy by the dipole that may then excite surface plasmons-polaritons (SP) at the metallic layer surface. Although it is true that SP modes are waveguide modes, the nature of SP waveguide modes differs significantly from that of Modes I, II, or III emitted light. First of all, the electromagnetic fields of SP modes are confined very closely to the dielectric/metal interface (i.e., the metal electrode/organic layer interface) whereas the fields of Mode III waveguide modes are distributed throughout the OLED waveguide core. (The OLED waveguide core is defined as the combined electron-injection layer (EIL), electron-transport layer (ETL), emissive layer(s), hole-transport layer (HTL), and transparent electrode layers.) A second difference between Mode III and SP waveguide modes is that both the real and imaginary parts of the complex effective indexes, $n_{eff}$, of these two modes are quite different. Mode III waveguide modes are characterized by $n_{glass}$<Real$(n_{eff})$<Real$(n_{core})$, where $n_{glass}$ is the refractive index of the glass substrate and $n_{core}$ is the index of refraction of the core medium that has the largest real part. On the other hand, Real$(n_{eff})$>Real$(n_{core})$ for SP waveguide modes. In addition, Imaginary$(n_{eff})$ for SP modes is considerably larger than that of Mode III modes. This is another way of stating the fact that SP modes exhibit more loss than do Mode III modes. Finally, Mode III waveguide modes can be either transverse-electric (TE) or transverse magnetic (TM) polarized whereas SP waveguide modes can only be TM polarized. Furthermore, the surface plasmon-polaritons couple to the bulk plasmons, which are non-radiative. Henceforth, SP modes will be referred to as "Mode IV" energy, in keeping with the spirit of the previously-developed emitted light nomenclature.

Applicants have developed a mathematical model that describes the energy output from a radiating dipole in an OLED structure in terms of coupling into the various modes. This model describes the excitonic sources in OLED devices as classical point dipole harmonic oscillators that are embedded in a dielectric medium with no light absorption that is bounded on both sides by planar metal and/or dielectric layers. According to the model, each dipole interacts with the surrounding OLED structure by virtue of its own electromagnetic radiation, which is reflected back by the surrounding structure. In this way, the dipole does work on the surrounding structure which results in modification of the radiative damping that the dipole would otherwise experience in a completely uniform dielectric medium (e.g. free space). The power spectrum specifies the power emitted by the dipole as a function u, where $u \equiv k_p/k$ is the transverse (in-plane) wavenumber normalized with respect to the free-photon wavenumber in the emitting medium. As demonstrated by the model, the radiation pattern as well as the total amount of power radiated by a radiating dipole can be severely modified by the presence of surrounding plasmon-supporting metallic and light-absorbing dielectric layers. In this model, it is assumed that the core waveguide thickness is held constant and the dipole sources are located in a very thin emissive layer. The dielectric materials between the electrodes are presumed to be non-absorbing.

The structure that is modeled employs, in order, an air cover, a reflective metal electrode, an electron-transport layer, a light-emissive layer, a hole-transport layer, a transparent electrode, and a glass substrate. In this model, the optical indices of typical OLED materials found in the prior art are employed. Glass having an index of 1.4610 is used for the substrate, the transparent electrode is presumed to be ITO having an index of 1.8029+0.0001i, the hole transport layer is presumed to comprise NPB having an optical index of 1.8259 with no imaginary part, the electron transport layer is presumed to comprise $Alq_3$, with an index of 1.7419, and the reflective electrode is presumed to comprise MgAg having an index of 0.5247+3.8264i. The emissive layer is assumed to be infinitesimally thin and located at the ETL/HTL junction and the wavelength is assumed to be 528 nm.

Figure 11:
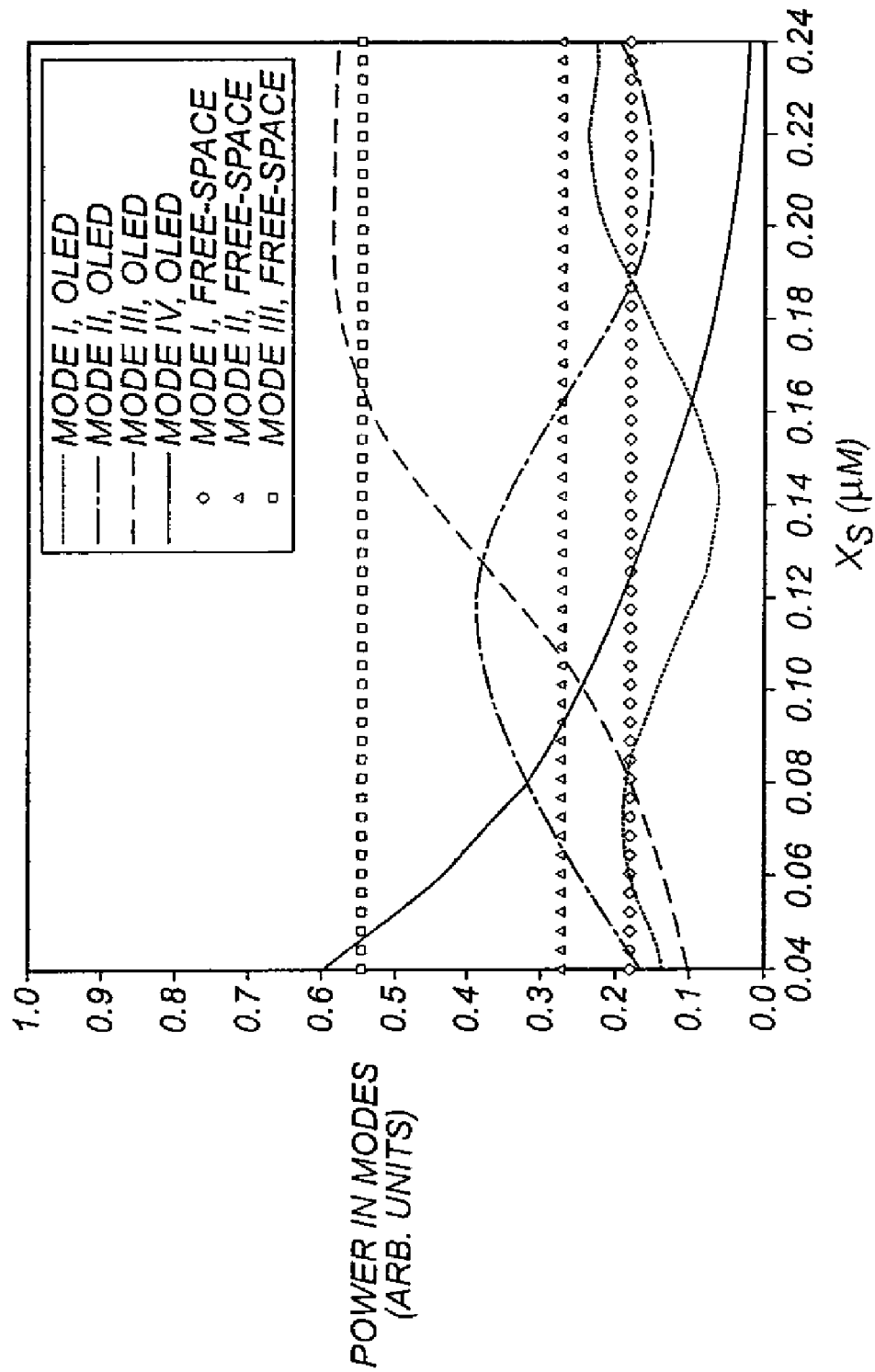
FIG. 11 is a graph demonstrating the relative energy in various modes of light as a function of layer separation.

Referring to FIG. 11, the model is employed to create a graph of the relative amounts of energy emitted into the various modes for the structure described above (dipole contained within an OLED structure employing a transparent ITO electrode and a reflective metal electrode). For comparison, the modal distribution of a free-space dipole is also shown by the horizontal lines. For the purposes of this discussion, a free-space dipole is defined to be one embedded in an infinite medium of uniform index of refraction. In the model, the index of the free-space medium corresponds to that of $Alq_3$. The Mode I light for the free-space dipole is obtained by integrating the power spectrum of a free-space dipole over all emission angles less than the critical angle corresponding to an air/$Alq_3$ interface. Mode II light is obtained by integrating the power spectrum from the critical angle of the air/$Alq_3$ interface to the critical angle corresponding to the glass/$Alq_3$ interface. The remainder of the area under the power spectrum curve of the free-space dipole is designated mode III. In FIG. 1 the sum of the powers in Modes I, II, III, and IV of the OLED dipole is normalized to one arbitrary unit for each value of $x_s$, as is the sum of the powers in Modes I, II, and III of the free-space dipole. By comparing the relative amount of energy in the surface-plasmon mode to the other modes for the model employing an OLED with a metallic layer, it can be seen that a high percentage of energy may be trapped in surface plasmons. In contrast, the free-space dipole structure (and accordingly similar to an OLED without a metal layer) does not have any light trapped in surface plasmons. In both cases, however, a significant fraction of light is trapped in mode III; this light is not emitted from the OLED device but rather is trapped within the organic and transparent electrode layers.

While light reflective metal layers are typically employed in OLED devices to redirect light to the intended emission side of the device, as discussed above their use may also support the undesired absorption of energy into surface plasmon-polariton modes. While increasing the distance between a metallic electrode and a light-emitting layer by employing thicker intermediate layers may be possible, thicker intermediate layers will result in increased voltages and/or light absorption. According to the present invention, by employing non-metallic reflective layers in place of plasmon-supporting reflective metal layers in the OLED in combination with non-metallic transparent electrodes and a scattering layer, the light emitted from the OLED device may be increased.

Figure 12:
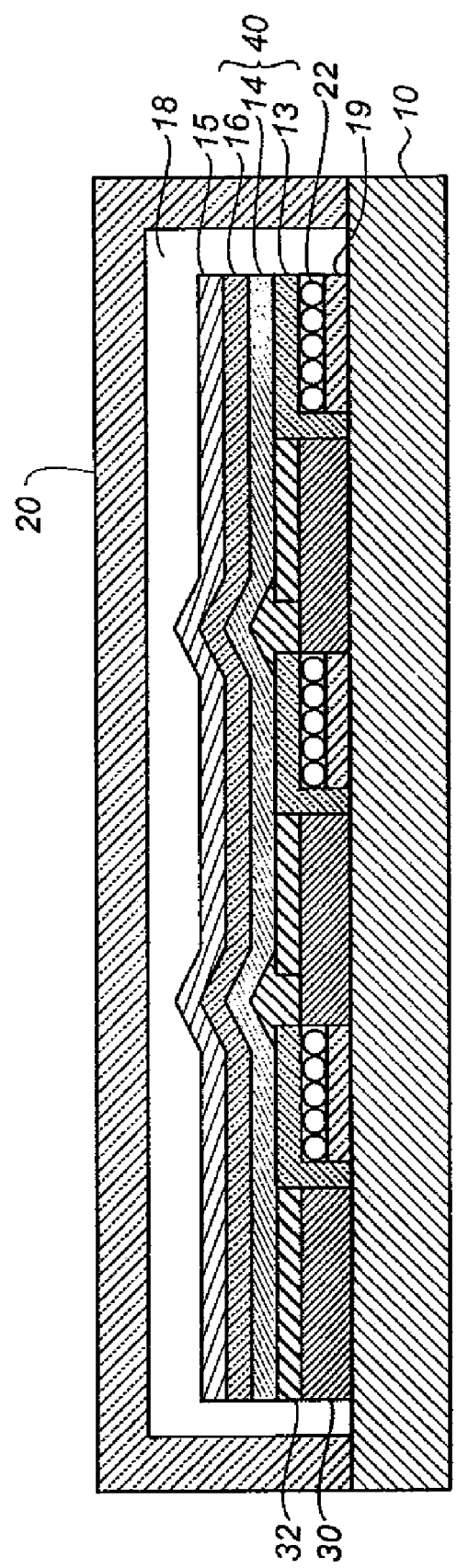
FIG. 12 illustrates a cross section of a bottom-emitter OLED device having non-metallic reflective and scattering layers according to an embodiment of the present invention.

Referring to FIG. 1, according to an embodiment of the present invention, a top-emitting organic light-emitting diode (OLED) device comprises first and second non-metallic transparent electrodes 13 and 16, and one or more layers 14 of organic material formed between the first and second transparent electrodes 13 and 16, forming an OLED 40, the layers of organic material including one or more light-emitting layers; one or more non-metallic reflective layers 15 located on a side of either of the first or second transparent electrodes 13 or 16 opposite to the organic material layers 14; and a transmissive scattering layer 22 in optical contact with the organic material layers and the electrodes. An encapsulating cover 20 encapsulates and protects the OLED materials and electrodes. A transparent low-index element 19 (possibly an air gap) having a refractive index lower than the refractive index of the encapsulating cover through which light is emitted from the OLED device and lower than the refractive index range of the OLED element materials may be employed between the transparent electrode 16 and the cover 20 to improve the sharpness of the OLED device, as is disclosed in co-pending, commonly assigned U.S. Ser. No. 11/065,082, filed Feb. 24, 2005, the disclosure of which is hereby incorporated by reference. Since the low-index element or gap 19 has an optical index lower than that of the OLED elements and the cover 20, any light that is scattered into the gap 19 by the scattering layer will pass through the gap and the cover 20, since light passing from a low-index material (the gap 19) into a higher index material (the cover 20) cannot experience total internal reflection. Alternatively, as illustrated in FIG. 12, a low-index layer 19 may be employed under the scattering layer 22 in a bottom-emitting embodiment.

By optical contact is meant that there are no intervening layers having an optical index lower than the optical index of any of the organic and transparent electrode layers and that light that passes through any one of the layers will encounter the scattering layer. The one or more organic layers may include one or more of the following layers: a hole-injection layer, hole-transport layer, electron-injection layer, electron-transport layer, and a light-emitting layer. More than one emissive layer may be employed in the present invention, for example to create a white light output. These layers are well known in the OLED art.

The transparent electrodes 13 and 16 are non-metallic so as to be non-plasmon supporting, and accordingly may comprise any conductive materials having a dielectric constant with a positive real part or that do not have free electrons in a conduction band. For example, transparent electrodes 13 and 16 may comprise metal oxides such as indium tin oxide, or indium zinc oxide, or conductive polymers such as polythiophene.

As shown in FIG. 1, transmissive scattering layer 22 is located on the side of the organic layers 14 and transparent electrodes 13 and 16 opposite the non-metallic reflector 15. Alternatively, the scattering layer 22 may be located between the transparent electrodes 13 and 16 (if the scattering layer 22 is conductive). Typically, but not necessarily, scattering layer 22 is adjacent to a transparent electrode 13 or 16 or adjacent to protective or optically useful layers formed on a transparent electrode on the side of the electrode opposite the organic layers. Useful protective and optical layers are described in, co-pending, commonly assigned U.S. Ser. No. 11/122,295 filed May 4, 2005, the disclosure of which is hereby incorporated by reference. The present invention may be employed in both top- and bottom-emitting embodiments. Referring to FIG. 12, the positions of the non-metallic reflective layer 15 and the scattering layer are reversed with respect to the substrate 10.

As employed herein, a light scattering layer is an optical layer or layer having a surface that tends to redirect any light that impinges on the layer or surface from any direction. The light scattering layer 22 is optically integrated into the OLED device for scattering light emitted by the light-emitting layers and reflected by the reflective layer 15. The presence of an optically integrated scattering layer 22 in accordance with the present invention defeats total internal reflection of emitted light that might otherwise propagate between and in the electrodes and organic layers of the OLED element. Optical integration of the scattering layer within the OLED device means that light emitted by an OLED element is redirected. For example, a light scattering layer integrated into a reflective electrode or reflector may scatter the reflected light and may be constructed with a rough surface rather than a smooth planar surface. If the light scattering element is integrated into a transparent layer, the light scattering element scatters the light that passes through the layer.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements having a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than approximately one-tenth the wavelength of the emitted light, then it is desirable for the index of refraction of at least one material in the scattering layer 22 to be approximately equal to or greater than the refractive indices of the organic layers 14. This is to insure that all of the light trapped in the organic and conductor layers can experience the direction altering effects of scattering layer 22. If scattering layer 22 has a thickness less than approximately one-tenth the wavelength of the emitted light, then the materials in the scattering layer need not have such a preference for their refractive indices.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.03 to 2, and a large difference is generally desired. The thickness of the scattering layer, or size of features in, or on the surface of, a scattering layer may be, for example, 0.03 to 50 µm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

The scattering layer 22 should be selected to get the light out of the OLED as quickly as possible so as to reduce the opportunities for re-absorption by the various layers of the OLED device. If the scattering layer 22 is to be located between the organic layers 14 and the transparent low-index element 19, or between the organic layers 14 and a reflective layer 15, then the total diffuse transmittance of the same layer coated on a glass support should be high (preferably greater than 80%). In other embodiments, where the scattering layer 22 is itself desired to be reflective, then the total diffuse reflectance of the same layer coated on a glass support should be high (preferably greater than 80%). In all cases, the absorption of the scattering layer should be as low as possible (preferably less than 5%, and ideally 0%).

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

One problem that may be encountered with such scattering layers is that the organics may not prevent the electrodes from shorting near the sharp edges associated with the scattering elements in the layer 22. Although the scattering layer may be planarized, typically such planarizing operations do not form a perfectly smooth, defect-free surface. To reduce the possibility of shorts between the transparent electrodes 13 and 16, a short-reduction layer (not shown) may be employed between an electrode and the organic layers, when the electrode is formed over the scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

The one or more non-metallic reflective layers 15 may, in various embodiments, comprise a variety of materials, layers and structures. As with transparent electrodes 13 and 16, reflective layer 15 is non-metallic so as to be non-plasmon supporting, and accordingly may comprise any materials having a dielectric constant with a positive real part or that do not have free electrons in a conduction band. In preferred embodiments, the non-metallic reflective layer 15 is partially, largely, or completely co-extensive with either the first or second transparent electrodes 13 or 16.

Figure 3:
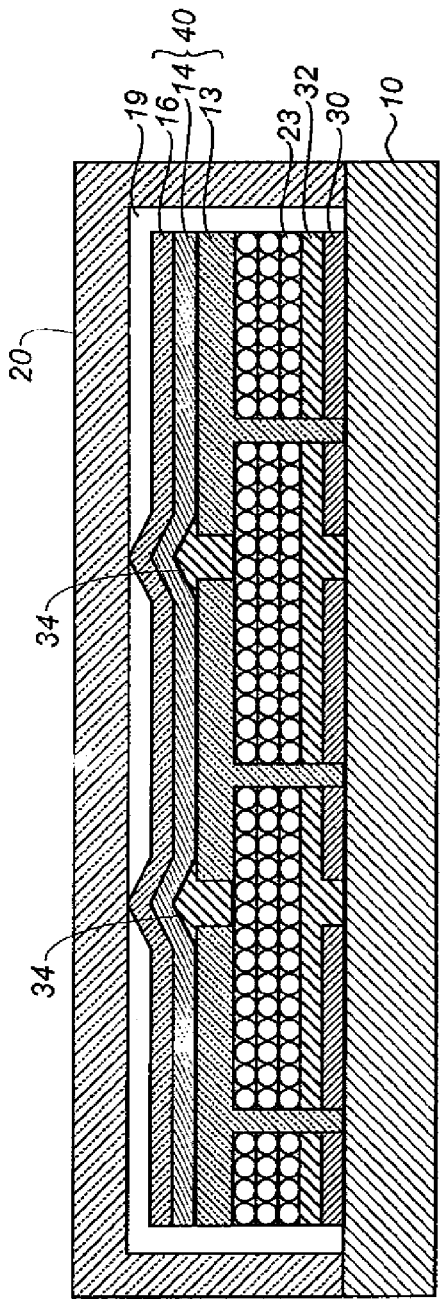
FIG. 3 illustrates cross sections of a top-emitter OLED device having a non-metallic reflective scattering layer according to an alternative embodiment of the present invention.

While FIG. 1 illustrates use of a transmissive light-scattering layer 22 in optical contact with the organic material layers and the electrodes, in an alternative embodiment at least one of the one or more non-metallic reflective layers 15 may comprise a reflective scattering layer in optical contact with the organic material layers and the electrodes. Referring to FIG. 3, e.g., in one embodiment the non-metallic reflective layers and scattering layer are embodied in a reflective scattering element 23. The reflective scattering element 23 provides multiple layers of scattering materials or, alternatively, a layer of scattering materials thick relative to the organic layers 14. Such materials can comprise, for example titanium dioxide particles having a particle sizes of a mean radius of 500 nm to 2,000 nm in a matrix of lower-index material, for example polymers. Transmissive scattering layers such as may be employed in FIG. 1 embodiment are relatively thin, for example 2 microns thick, such that light will be scattered in both the forward and backward directions. Reflective scattering layers as may be employed in FIG. 3 embodiment are typically thicker than a transmissive scattering layer, so that light will be primarily scattered primarily in the backward direction. For example, applicant has constructed a reflective scattering layer employing titanium dioxide particle in a matrix having a thickness of 8 microns and successfully constructed an OLED device there-upon. Because the reflective scattering element 23 is relatively thick, light that impinges on the layer is internally scattered and most of the light eventually escapes from the side of the scattering element 23 from which the light entered the scattering element 23. In this embodiment, the scattering element 23 serves both to provide a non-metallic reflector and the scattering layer in one element or layer. Preferably, the optical index of the reflective scattering layer matrix is matched to that of the organic materials or the transparent electrodes.

Figure 4:
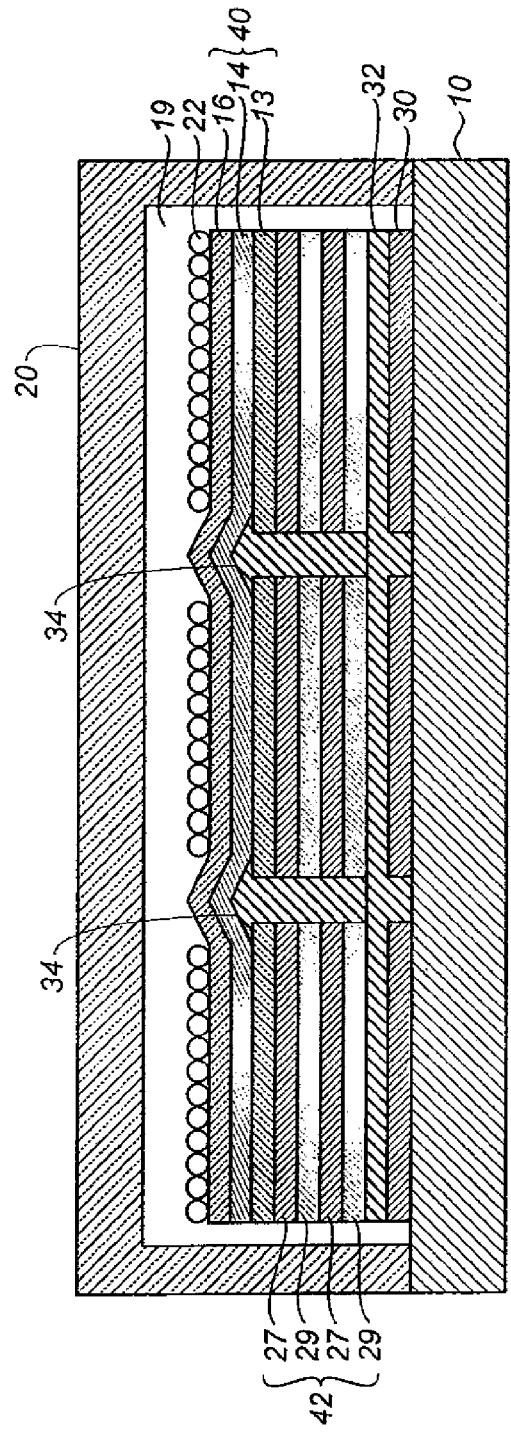
FIG. 4 illustrates a cross section of a top-emitter OLED device having non-metallic reflective and scattering layers according to another embodiment of the present invention.

Referring to FIG. 4, in an alternative embodiment of the present invention, the non-metallic reflective layer comprises a plurality of layers having varying optical indices. The use of stack 42 of materials 27 and 29 with alternating optical indices to provide reflection is known in the art (e.g., dielectric stack reflectors, including quarter-wave plate structures) and the methods taught may be applied in the present invention. In particular, since good reflection is desired across a wide range of angles, the methods discussed in the recent literature on dielectric omnidirectional reflectors may be employed (see, for example, W. Lin et al., J. Modern Optics 52, 1155-1160 (2005) and references therein). Other techniques known in the art, such as the use of "chirped" structures may be helpful to provide a stack that gives true omnidirectional reflection, particularly over a sufficiently broad spectrum of wavelengths. For the stack 42, both polymeric and non-polymeric materials may be employed. Moreover, the materials stack may be tuned in thickness and optical index to provide preferential reflection of light in a given frequency range, for example red, green, blue, cyan, or yellow. Alternatively, the materials stack may reflect broadband light that may be substantially white.

Figure 5:
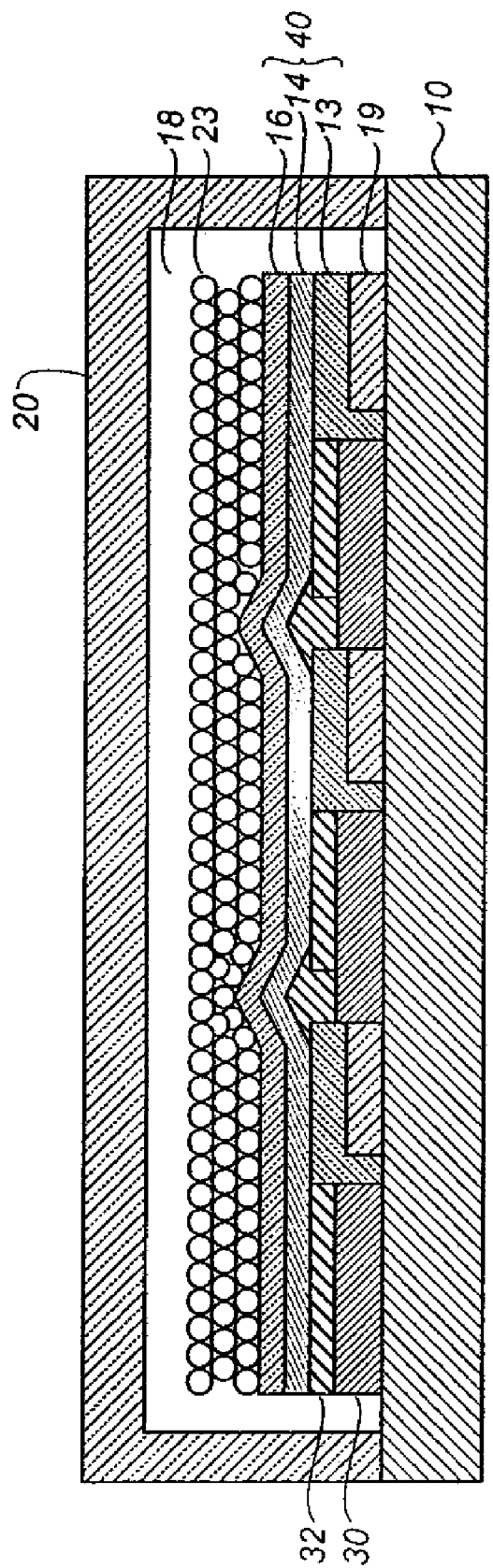
FIG. 5 illustrates a cross section of a bottom-emitter OLED device having a non-metallic reflective scattering layer according to an embodiment of the present invention.
Figure 10:
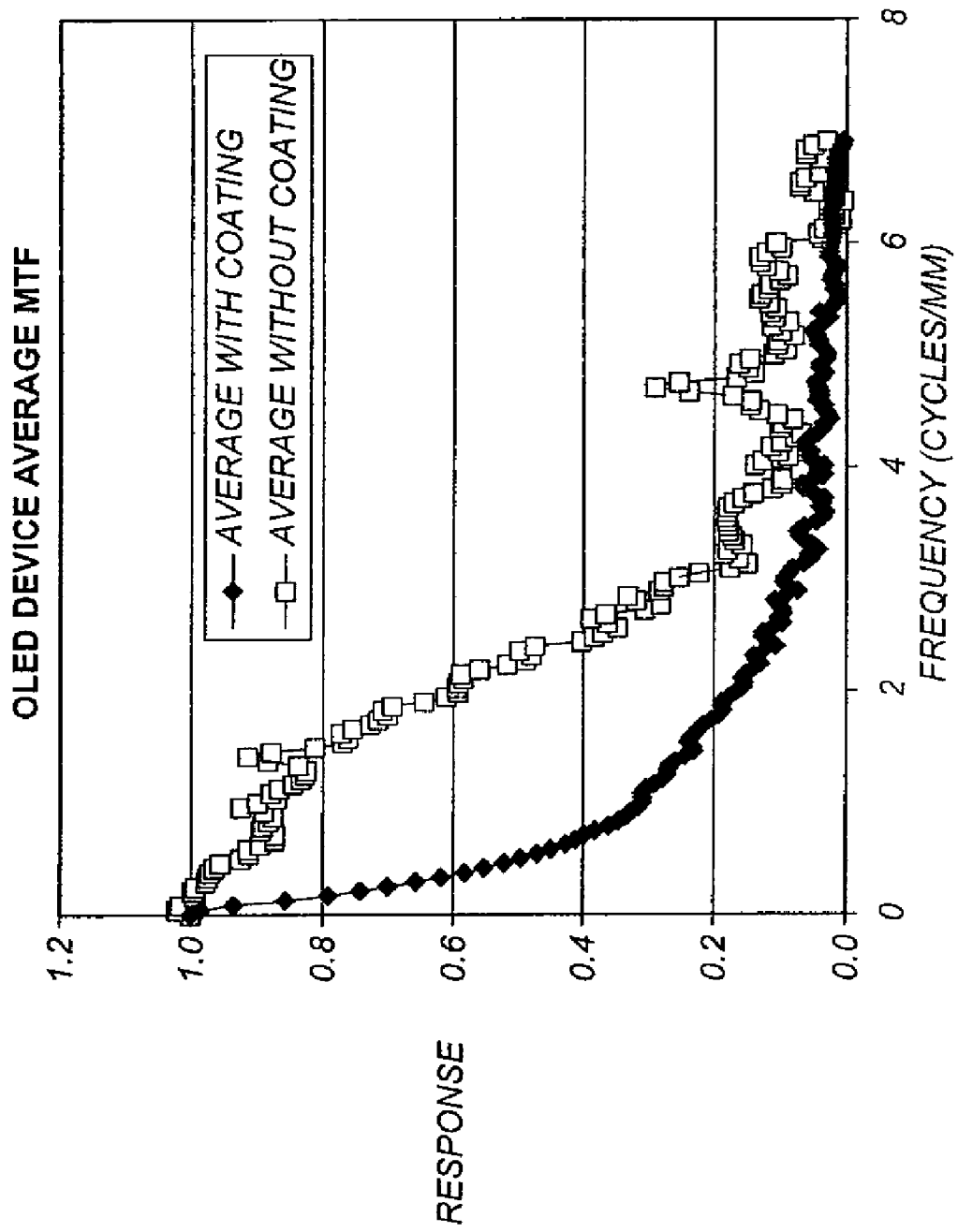
FIG. 10 is a graph demonstrating the loss in sharpness due to a scattering layer in a prior-art active-matrix bottom-emitting OLED device.

FIG. 3 illustrates a top-emitting OLED according to an embodiment of the present invention having a reflective scattering element 23. Referring to FIG. 5, a reflective scattering element 23 may also be employed in a bottom-emitting configuration. In this embodiment, the reflective scattering element 23 is located on the side of transparent electrode 16 opposite the organic layers 14.

Although the OLED layer structures have been described with a cathode on the top and an anode on the bottom near the substrate, it is well known that the organic layers can be inverted and the positions of the anode and cathode exchanged. Such inverted structures are included in the present invention.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation. One or more very thin layers of transparent encapsulating materials may be deposited on the electrode 16. In this case, the scattering layer 22 may be deposited over the layers of encapsulating materials. This structure has the advantage of protecting the electrode 16 during the deposition of the scattering layer 22. Preferably, the layers of transparent encapsulating material have refractive indices comparable to the first refractive index range of the transparent electrode and organic layers, or is very thin (e.g., less than about 0.2 micron) so that wave guided light in the transparent electrode and organic layers will pass through the layers of transparent encapsulating material and be scattered by the scattering layer 22.

OLED devices of this invention can employ various well-known optical effects in order to enhance their properties if desired. This includes optimizing layer thicknesses to yield maximum light transmission, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to Van Slyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 3, 4, 5 light rays
10 substrate
12 reflective electrode
13 transparent electrode
14 organic layer(s)
15 non-metallic reflective layer
16 transparent electrode
18 gap
19 transparent low-index element
20 encapsulating cover
22 scattering layer
23 non-metallic reflective scattering layer
27 reflective stack element 29 reflective stack element
30 thin-film circuitry
32 insulator
34 insulator
40 OLED element
42 stack
50, 52, 54, 56, 58 pixels

The invention claimed is:

1. An organic light-emitting diode (OLED) device, comprising:
   first and second non-metallic transparent electrodes, and one or more layers of organic material formed between the first and second non-metallic transparent electrodes, the one or more layers of organic material including one or more light-emitting layers that emit emitted light and that emit trapped light into the first and second non-metallic transparent electrodes and the one or more layers of organic material; and
   a non-metallic reflective layer that reflects the emitted light located on a side of either of the first or second non-metallic transparent electrodes opposite to the one or more organic material layers;
   wherein the device further comprises a non-metallic light transmissive scattering layer that scatters trapped light into emitted light, external to, and in optical contact, with the organic material layers and the electrodes or wherein the non-metallic reflective layer comprises a non-metallic reflective scattering layer that scatters trapped light into emitted light, external to, and in optical contact with, the one or more organic material layers and the electrodes;
   a light-transmissive substrate through which the emitted light emitted by the one or more light-emitting layers is transmitted;
   a low-index element having an optical refractive index lower than the optical refractive index of the light-transmissive substrate, the one or more light-emitting layers; and
   wherein the low-index element is located between the light-transmissive substrate and the first and second non-metallic electrodes and between the light-transmissive substrate and the non-metallic light-transmissive scattering layer.

2. The OLED device of claim 1, wherein the non-metallic reflective layer comprises a plurality of non-metallic layers with differing optical indices.

3. The OLED device of claim 1, wherein the non-metallic reflective layers comprises a reflective scattering layer in optical contact with the one or more organic material layers and the electrodes.

4. The OLED device of claim 3, wherein the non-metallic reflective scattering layer comprises scattering particles.

5. The OLED device of claim 4, wherein the scattering particles are formed in a layer having two sides and comprising a matrix having an optical index lower than the optical index of the scattering particles, or wherein a layer having an optical index lower than the optical index of the scattering particles is coated over one side of a layer of scattering particles.

6. The OLED device of claim 3, wherein the non-metallic reflective scattering layer has a light scattering surface.

7. The OLED device of claim 1, wherein the first and/or second non-metallic transparent electrodes comprises a metal oxide.

8. The OLED device of claim 1, wherein the one or more organic layers includes two or more light-emitting layers.

9. The OLED device of claim 1, wherein the non-metallic reflective layers is co-extensive with the first or second transparent electrode.

10. The OLED device of claim 1, wherein the non-metallic reflective layers reflects light over the visible spectrum.

11. The OLED device of claim 1, wherein the non-metallic reflective layer preferentially reflects light of a given frequency range within the visible spectrum.

12. The OLED device of claim 11, wherein the frequency range corresponds to red, green, blue, cyan, or yellow.

13. The OLED device of claim 1, wherein the OLED device is a display device, an area illumination device, or a backlight.

14. The OLED device of claim 1, further comprising a substrate, and wherein the non-metallic reflective layer is between the substrate and the non-metallic transparent electrodes and the one or more organic material layers.

15. The OLED device of claim 1, wherein the non-metallic reflective layer comprises materials having a dielectric constant with a positive real part.

16. The OLED device of claim 1, wherein the non-metallic reflective layer comprises materials that do not have free electrons in a conduction band.

* * * * *